US010453972B2

(12) United States Patent
Enichlmair

(10) Patent No.: US 10,453,972 B2
(45) Date of Patent: Oct. 22, 2019

(54) INTEGRATED OPTICAL SENSOR AND METHOD OF PRODUCING AN INTEGRATED OPTICAL SENSOR

(71) Applicant: ams AG, Unterpremstaetten (AT)

(72) Inventor: Hubert Enichlmair, Weinitzen (AT)

(73) Assignee: ams AG, Unterpremstaetten (AT)

( * ) Notice: Subject to any disclaimer, the term of this patent is extended or adjusted under 35 U.S.C. 154(b) by 37 days.

(21) Appl. No.: 15/533,989

(22) PCT Filed: Dec. 4, 2015

(86) PCT No.: PCT/EP2015/078704
§ 371 (c)(1),
(2) Date: Jun. 7, 2017

(87) PCT Pub. No.: WO2016/091757
PCT Pub. Date: Jun. 16, 2016

(65) Prior Publication Data
US 2018/0337291 A1 Nov. 22, 2018

(30) Foreign Application Priority Data

Dec. 8, 2014 (EP) .................................. 14196808

(51) Int. Cl.
*H01L 31/0232* (2014.01)
*H01L 31/0216* (2014.01)
(Continued)

(52) U.S. Cl.
CPC .... *H01L 31/02165* (2013.01); *H01L 27/1443* (2013.01); *H01L 27/14621* (2013.01);
(Continued)

(58) Field of Classification Search
CPC ........... H01L 31/02165; H01L 27/1443; H01L 31/02164; H01L 31/02005
See application file for complete search history.

(56) References Cited

U.S. PATENT DOCUMENTS

2007/0040194 A1   2/2007   Misawa
2007/0284687 A1   12/2007  Rantala
(Continued)

FOREIGN PATENT DOCUMENTS

EP   2772939 A1   9/2014
EP   2793271 A1   10/2014
(Continued)

OTHER PUBLICATIONS

Hecht, Eugene, "Optics, Antireflection Coatings", Optics, Addison-Wesley Publishing, US, Jan. 1, 2002, p. 428, XP002465206.
(Continued)

*Primary Examiner* — Stephen M Bradley
*Assistant Examiner* — Wasiul Haider
(74) *Attorney, Agent, or Firm* — Fish & Richardson P.C.

(57) ABSTRACT

An integrated optical sensor comprises a semiconductor substrate (1), an integrated circuit (2), a dielectric layer (6), a wiring (4), a structured filter layer (7) and a diffuser (10). The semiconductor substrate (1) has a main surface (11) and the integrated circuit (2) is arranged in the substrate (1) at or near the main surface (11). Furthermore, the integrated circuit (2) comprises at least one light sensitive component (3). The dielectric layer (6) comprises at least one compound of the semiconductor material. The dielectric layer (6) is arranged on or above the main surface (11). The wiring (4) is arranged in the dielectric layer (6) and provides an electrical connection to the integrated circuit (2), i.e. the wiring is connected to the integrated circuit (2). The structured filter layer (7) is arranged on the dielectric layer (6) and faces the at least one light sensitive component (3), i.e. the diffusor (10) is positioned over the structured filter layer (7). In particular, the structured filter layer (7) is adapted for diffused incident light. The diffuser (10) is arranged on the structured filter layer (7).

17 Claims, 4 Drawing Sheets

(51) Int. Cl.
*H01L 27/146* (2006.01)
*H01L 27/144* (2006.01)
*H01L 31/02* (2006.01)

(52) U.S. Cl.
CPC .. *H01L 27/14623* (2013.01); *H01L 27/14636* (2013.01); *H01L 27/14685* (2013.01); *H01L 31/02005* (2013.01); *H01L 31/02164* (2013.01); *H01L 2224/11* (2013.01)

(56) References Cited

U.S. PATENT DOCUMENTS

| | | | |
|---|---|---|---|
| 2008/0088722 A1* | 4/2008 | Takeichi | G01J 1/02 348/273 |
| 2012/0187281 A1* | 7/2012 | Kerness | H01L 27/14618 250/214.1 |
| 2012/0241633 A1* | 9/2012 | Smith | G01J 1/429 250/370.07 |
| 2013/0032916 A1 | 2/2013 | Lin et al. | |
| 2014/0151840 A1* | 6/2014 | Cheng | H01L 27/14636 257/460 |
| 2014/0239478 A1* | 8/2014 | Hong | H01L 23/4334 257/698 |
| 2015/0109775 A1* | 4/2015 | Schwalenberg | F21V 23/0457 362/231 |
| 2015/0187636 A1* | 7/2015 | Ho | H01L 24/82 257/774 |
| 2016/0035914 A1* | 2/2016 | Deliwala | H01L 31/02327 257/432 |
| 2016/0322519 A1* | 11/2016 | Schrank | H01L 21/76898 |

FOREIGN PATENT DOCUMENTS

JP 2000357785 A 12/2000
WO WO-2010134063 A2 11/2010

OTHER PUBLICATIONS

Office Action issued in European Application No. 14196808.1-1212, dated May 13, 2019 (7 pages).

* cited by examiner

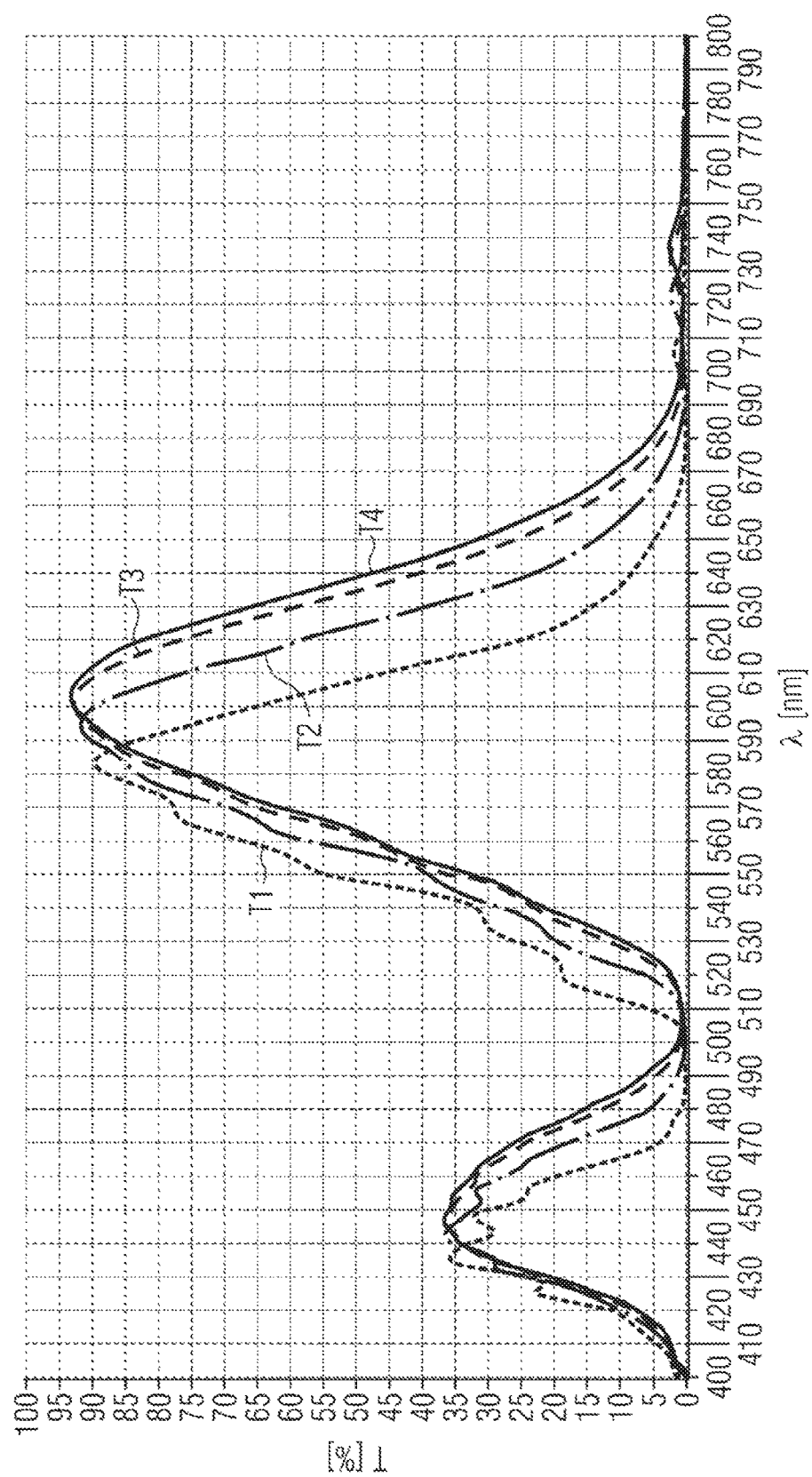

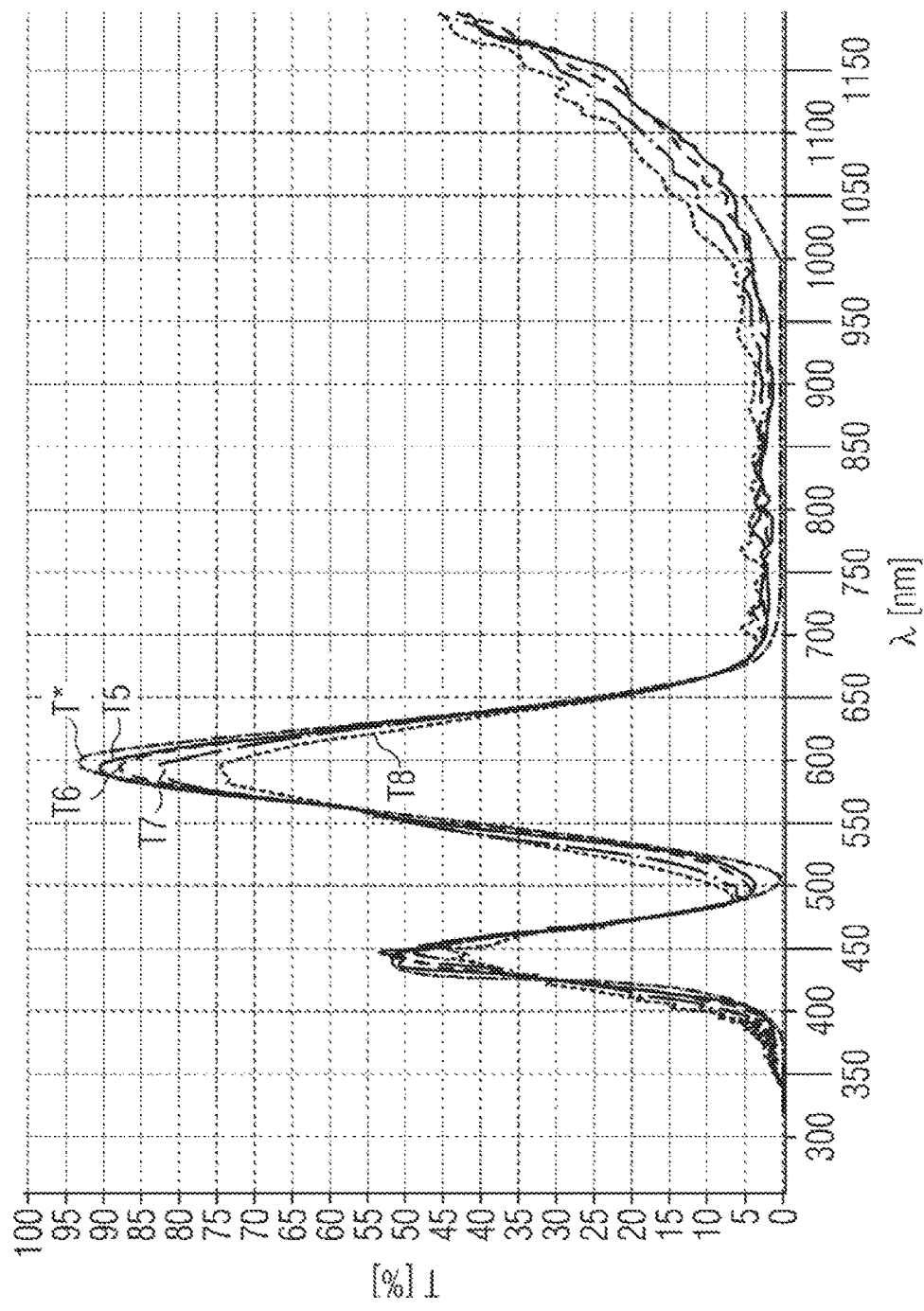

INTEGRATED OPTICAL SENSOR AND METHOD OF PRODUCING AN INTEGRATED OPTICAL SENSOR

The present invention relates to an integrated optical sensor and to a method of producing an integrated optical sensor.

BACKGROUND OF THE INVENTION

Optical sensors, including (ambient) light sensors, proximity sensors and color sensors, for example, are used in various applications to detect the presence of (ambient) light, motion or proximity of an object as well as light color and intensity. Besides light sensitive components such as photo-diodes optical sensors often comprise dedicated filters such as interference or plasmonic filters.

An interference filter, or dichroic filter, is an optical filter that reflects one or more spectral lines or spectral bands while transmitting others. Typically, these types of filters maintain very low absorption for all wavelengths of interest. Interference filters consists of alternating layers of dielectric materials and thin metal films with varying index of refraction in the ultra-violet, visible and/or infrared spectrum. The succession and properties of the layers can be controlled to a high degree and determine the optical properties of the interference filter, for example, whether it is a high-pass, low-pass, band-pass or band rejection filter.

Interference filters, however, have the inherent disadvantage that their optical properties are depending on the angle under which light incidents upon the filter. Among other things directional changes in the optical properties of an interference filter are affected by increasing the angle of incidence or angle of aperture. Generally, the transmission wavelength or edge position of interference filters is shifted towards shorter wavelengths when increasing the angle of incidence. FIG. 6 shows the transmission (in %) as a function of wavelength λ (in nm) for several transmission curves T1, T2, T3, and T4 of a tristimulus X1 filter, as an example. The filter is designed for parallel incident light. The transmission curves T1, T2, T3, T4 have been recorded for 30°, 20°, 10°, 0° angle of incidence (measured with respect to a surface normal of the filter), respectively. The shift of the filter characteristic in dependence on the angle of the incident, parallel light is considerable.

FIG. 7 shows transmission curves T5, T6, T7, and T8 of a tristimulus X2 filter which is designed for diffusive incident light having the same target function as the filter X1 of FIG. 5. Interference filters can be adapted for diffused incident light by means of succession and properties of the layers which make up the filter, e.g. layer distances and index of refraction. This can be achieved by dedicated optical simulation software, for example. The transmission curves T5, T6, T7, T8 have been recorded for 0°, 10°, 20°, 30° angle of incidence (measured with respect to a surface normal of the filter), respectively. The shift of the filter characteristic in dependence on the angle of the incident, diffusive light is largely reduced (compare also transmission curve T*). As can be seen in the drawing interference filters adapted for diffused incident light have practically insignificant shift of the filter characteristic angles of incidence for 0°, 10°, 20°, 30° angle of incidence, i.e. smaller than 20 to 10 nm, in particular smaller than 5 nm. However, such filter does not show a good performance under typical operating conditions without further external optics.

Recently, plasmonic colour filters have become available which employ surface-plasmon based nanostructures. Such plasmon filters offer the ability to efficiently manipulate light due to their small dimensions. By changing their nanostructure, colour filters can be produced which are capable of transmitting arbitrary colours at high spatial resolution with the promise of compact device architectures. However, the spectral responsivity of plasmonic filters also changes with the angle of incident light.

FIG. 5 shows a prior art solution of an optical sensor with an external aperture and external diffusor. Basically, a black cylindrical tube 26 is placed over the optical sensors 27. In order to avoid shadowing effects, it is advantageous to place an additional diffusor 28 on top of this cylinder. However, such a design is rather bulky and cannot be fully integrated, e.g. into a single and small sensor.

There is a need in the art to provide an integrated optical sensor and a method of producing an integrated optical sensor which supports wafer level integration of optical sensors with optical filters and reduced angular dependence of the filter transmission characteristics.

SUMMARY OF THE INVENTION

The semiconductor substrate has a main surface and the integrated circuit is arranged in the substrate at or near the main surface. Furthermore, the integrated circuit comprises at least one light sensitive component. The dielectric layer comprises at least one compound of the semiconductor material. The dielectric layer is arranged on or above the main surface. The wiring is arranged in the dielectric layer and provides an electrical connection to the integrated circuit, i.e. the wiring is connected to the integrated circuit.

The structured filter layer is arranged on the dielectric layer and faces the at least one light sensitive component, i.e. the diffusor is positioned over the structured filter layer. In particular, the structured filter layer is adapted for diffused incident light. The diffuser is arranged on the structured filter layer. Optionally, the structured filter layer is arranged immediately on the dielectric layer and the diffuser is arranged immediately on the dielectric layer and structured filter layer such that the diffuser encloses the dielectric layer and structured filter layer.

During operation of the integrated optical sensor eventually light is incident and enters the sensor via the diffuser. The diffuser has the effect that both parallel and diffusive incident light is scattered and leaves the diffuser with a Lambertian intensity distribution, i.e. the light leaving of the diffuser is diffusive. The diffusive light then strikes the structured filter layer and is filtered according to its transmission characteristic. The so filtered light can then be detected by means of the light sensitive component of the integrated circuit and gives rise to an optical sensor signal.

The proposed integrated optical sensor can be produced by means of wafer level integration including optical filters, i.e. the structured filter layer. The sensor has considerably reduced angular dependence of the filter transmission characteristics. The wavelength shift characteristic to filters optimized for parallel incident light is largely reduced and improves on performance of true color and ambient light sensors. There is no need for implementation of a mechanical aperture or of an external diffusor. In fact, the diffuser is an integral part of the optical sensor design. The integrated optical sensor can be fabricated using CMOS compatible process steps which can be manufactured on a wafer level with no or little additional costs.

Optionally, the structured filter layer is arranged immediately on the dielectric layer. Furthermore, the structured filter layer is aligned with respect to the surface normal of the at least one light sensitive component. For example, the structured filter layer is centered with respect to the light sensitive component so that incident light reaches the light sensitive component only via the structured filter layer. The structured filter layer comprises at least one optical layer, optionally a stack of several optical layers. Examples of such filters are ultra-violet cutoff filters, infrared cutoff filters, photopic filters, color filters, band pass filters and any combination of thereof.

The term "adapted for diffused incident light" denotes that the structured filter layer has similar or even constant transmission characteristics within a certain interval of angles of incidence, such as larger than +/−10°. For example, diffused light is incident on the structured filter layer and a rather broad interval of angles of incidence. The at least one optical layer or stack of optical layers in the structured filter layer can be adjusted with respect to their succession (in the stack), optical and material properties (e.g. index of refraction). This can be achieved by dedicated state of the art optical simulation software, for example. The transmission curves for different angles of incidence measured with respect to a surface normal of the filter can be fine-tuned so that the shift of the filter characteristic is largely reduced for diffusive light. Hereinafter, the term "light" denotes electromagnetic radiation in the ultra-violet and visual range (UV-vis), for example, light between 300 and 1100 nm, as well as near infrared (NIR).

In a further embodiment of the integrated optical sensor the diffuser comprises a translucent material. The translucent material allows light to pass through, but does not necessarily (on a macroscopic scale) follow Snell's law, i.e. the light can be scattered at either of two surfaces of the diffuser undergoing a change in index of refraction, or internally, i.e. inside the diffuser.

The material of the diffuser may be translucent due to an integral material property or may comprise light scattering particles. In any case the material properties are adjusted so that scattering of incident light for those the principles of the geometric scattering. Thus, the light scattering particles have a size much larger than the wavelength of the diffused incident light. To a good degree of approximation the size of the light scattering particles is about ten times (or more) larger the wavelength of the incident light. At values of the ratio of particle size to wavelength more than about 10, the laws of geometric optics are mostly sufficient to describe the interaction of light with the particle.

The diffuser is adapted for defused incident light according to the principles of geometric scattering. Within this regime the scattering is largely independent of the wavelength of the incident light, as opposed to Rayleigh and Mie scattering, for example. The choice of the translucent material may be taken so that thermal, UV light or humidity stress do not effect transmission. Furthermore, the translucent material should not absorb light within the wavelength regime of interest. Light scattering particles can have a size between greater than 0.1 up to 15 µm, in particular 0.2 to 15 µm, and more particularly 1 to 15 µm. Possible light scattering particles are made from titanium oxide.

In a further embodiment of the integrated optical sensor the translucent material comprises an organic polymer compound or comprises a synthetic polymer compound or a combination thereof. For example, the organic polymer compound may be an epoxy resin and the synthetic polymer compound may be a silicone rubber.

In a further embodiment of the integrated optical sensor the structured filter layer comprises an interference filter and/or a plasmonic filter. The interference filter comprises alternating layers of dielectric materials with different index of refraction in the spectrum of the incident light. The thicknesses of the individual layers are determined by the filter design which is adapted for diffused incident light as mentioned above.

In a further embodiment the integrated optical sensor further comprises an electrically conductive through-substrate via in the dielectric layer contacting the wiring. Alternatively, the integrated optical sensor comprises an electrically conductive bonding pad in the dielectric layer contacting the wiring.

In a further embodiment of the integrated optical sensor the dielectric layer comprises an inter-metal layer and the wiring is arranged in the inter-metal layer. The inter-metal layer may comprise silicon dioxide and the structured filter layer is arranged immediately on the inter-metal layer.

In a further embodiment of the integrated optical sensor the dielectric layer comprises a passivation layer at least above the wiring. The passivation layer comprises a dielectric material different from the inter-metal layer. Finally, the wiring is arranged between the main surface and the passivation layer.

In a further embodiment of the integrated optical sensor the passivation layer is arranged at least above the through-substrate via and is arranged in or on the inter-metal layer. Furthermore, the passivation layer comprises an aperture facing the at least one light sensitive component. The inter-metal layer is free from the passivation layer within the aperture. The structured filter layer is arranged on the inter-metal layer above or in the aperture of the passivation layer.

In a further embodiment the integrated optical sensor comprises an optical on-chip light barrier. The optical light barrier is arranged on or near the diffuser and/or the dielectric layer.

A method of producing an integrated optical sensor comprises the steps of providing a semiconductor substrate, arranging a dielectric layer, a wiring, a structured filter and a diffuser.

The semiconductor substrate is provided with an integrated circuit comprising at least one light sensitive component at or near the main surface of the substrate. The dielectric layer comprises at least one compound of a semiconductor material and is arranged on or above the main surface. The wiring is arranged in the dielectric layer for providing an electrical connection to the integrated circuit.

The structured filter is arranged on the dielectric layer and faces the at least one light sensitive component. In particular, the structured filter layer is adapted for diffused incident light to be incident on the integrated optical sensor. Finally, the diffuser is arranged on the structured filter layer.

The proposed method allows for production of an integrated optical sensor by means of wafer level integration including an optical filter, i.e. the structured filter layer. The sensor has considerably reduced angular dependence of the filter transmission characteristics. The wavelength shift characteristic to filters optimized for parallel incident light is largely reduced and supports performance of true color and ambient light sensors. There is no need for implementation of a mechanical aperture or of an external diffusor. In fact, the diffuser is an integral part of the optical sensor design. The integrated optical sensor can be fabricated using CMOS compatible process steps which can be manufactured on a wafer level with no or little additional costs.

In a further embodiment of the method the diffuser is provided with a translucent material. The translucent material further comprises light scattering particles having a size much larger than the wavelength of the diffused incident light. Finally, the diffuser is arranged on the structured filter layer by means of wafer level spinning like resist coating and/or by means of wafer level molding.

The translucent material allows the diffuser to be adapted for defused incident light according to the principles of geometric scattering. Within this regime scattering is largely independent of the wavelength of incident light, as opposed to Rayleigh or Mie scattering, for example. The translucent material may be chosen so that thermal, UV light or humidity stress do not effect transmission. Furthermore, the translucent material should not absorb light within the wavelength regime of interest. Light scattering particles typically have a size greater than 0.1 up to 15 µm, in particular between 0.2 to 15 µm, and more particularly between 1 to 15 µm. Possible light scattering particles are made from titanium oxide, for example.

In a further embodiment the translucent material is made from an organic polymer compound or from a synthetic polymer compound or a combination thereof. In particular, the organic or synthetic polymer compound comprises an epoxy resin or silicone rubber, respectively.

In a further embodiment the method comprises the steps of forming the dielectric layer to further comprise an inter-metal layer and the passivation layer. In the passivation layer an aperture is provided facing the at least one light sensitive component. The inter-metal layer is left free from the passivation layer in the aperture. Finally, the structured filter layer is arranged on the inter-metal layer above or in the aperture of the passivation layer.

In a further embodiment of the method an optical light barrier is arranged on or near the diffuser and/or the dielectric layer. The optical light barrier can be manufactured using wafer level molding and serves to block light in a wide wavelength range, for example UV, Vis and near infrared. The optical light barrier effectively reduces optical crosstalk.

BRIEF DESCRIPTION OF THE DRAWINGS

In the following, the concept presented above will be described in more detail with respect to drawings in which exemplary embodiments are presented. Like components are referenced with like reference numerals.

FIG. 6 shows an exemplary transmission characteristic of a tri-stimulus X filter designed for parallel incident light, and FIG. 7 shows an exemplary transmission characteristic of a tristimulus X filter designed for diffused incident light,

DETAILED DESCRIPTION

Figure 1:
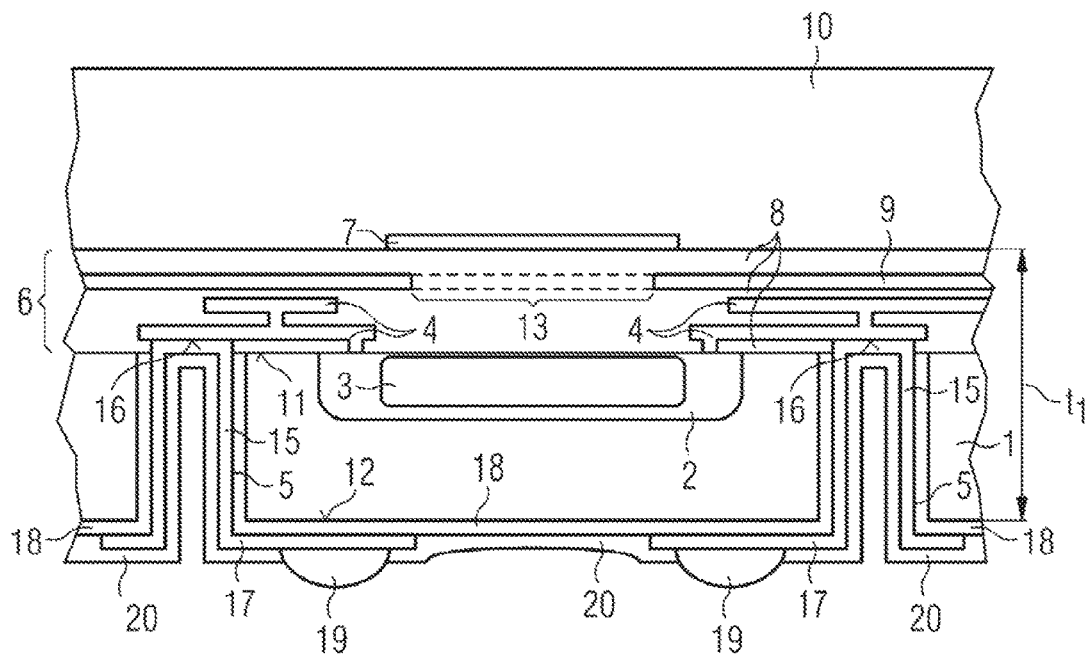
FIG. 1 shows an embodiment of an integrated optical sensor comprising a through-substrate via.

FIG. 1 shows an embodiment of an integrated optical sensor comprising a through-substrate via, for example a through silicon via. Generally, the integrated optical sensor comprises a semiconductor substrate 1, an integrated circuit 2, a dielectric layer 6, a wiring 4, a structured filter layer 7 and a diffuser 10.

The semiconductor substrate 1 comprises the integrated circuit 2 which has at least one light sensitive component 3 at or near a main surface 11. Typically, the semiconductor substrate 1 is a silicon wafer and a single or a plurality of integrated optical sensors can be fabricated at a time and be singulated by means of a wafer dicing process. Besides having the at least one light sensitive component 3 the integrated circuit 2 comprises further electronic components like a CMOS circuit and terminals to allow operation of the at least one light sensitive component 3. The at least one light sensitive component 3 typically comprises one or more photodiodes, optionally photodiodes sensitive in the visual or near infrared range. The photodiode(s) is integrated and used as a light sensor. The photodiodes may be integrated in a CMOS process technology.

The wiring 4 provides electrical connections to the integrated circuit 2 and is arranged on or above the main surface 11. By way of the integrated circuit 2 electrical connections are also provided to the at least one light sensitive component 3. The dielectric layer 6 comprises the wiring 4 which can be formed as a structured metal layer. The wiring 4 is used to provide electrical connections to components outside the integrated optical sensor. In this embodiment this is achieved by at least one through-substrate via 5. The at least one through-substrate via 5 comprises a metallization 15 and penetrates into the substrate 1 and connects a contact area 16 of the wiring 4 by means of a rear wiring 17. The rear wiring 17 can be a redistribution layer or the like, or a patterned inter-metal layer, for example.

The dielectric layer 6 is arranged on the main surface 11 and provides a basis to hold the structured filter layer 7 in place. The dielectric layer 6 comprises a material which is transparent to the target wavelength(s) for which the integrated optical sensor is used. The dielectric layer 6 may comprise at least one compound of a semiconductor material, for example, an oxide or nitride of a semiconductor material like silicon. Typically, the integrated optical sensor is sensitive to visual and near infrared radiation. Silicon dioxide or SiO2 provides such properties. Furthermore, the inter-metal layer 8 of the wiring 4 is arranged in the dielectric layer 6.

Optionally, a passivation layer 9 can be embedded into the dielectric layer 6. The passivation layer 9 can have a further dielectric material like a nitride of the semiconductor material, especially Si3N4, for example. Optionally, the passivation layer 9 has an aperture 13 above the light sensitive component 3. Alternatively, the passivation layer 9 comprises an entire layer, as indicated in FIG. 1 by dashed lines.

A further dielectric layer 18 is provided at a rear side of the substrate 1 and/or on a sidewall of the through-substrate via 5. This dielectric layer 18 insulates the metallization 15 and/or the rear wiring 17 from the semiconductor material of the substrate 1. Bumps 19 are connected to the rear wiring 17 for external electric connection. Furthermore, a passivation 20 covering parts of the rear side that are not used for the external electric connection. The passivation 20 may be a deposited silicon nitride layer, for example, and may especially be applied to provide a moisture barrier and/or a mechanical protection for the metal of the rear wiring 17 and the through-substrate via 5.

The structured filter layer 7 is arranged on the dielectric layer 6 or, for example, immediately on the dielectric layer 6. The structured filter layer 7 may be sputtered or deposited on top of the last layer of the CMOS process (such as planarized oxide) by which the light sensitive component of the integrated circuit has been arranged into the integrated optical sensor.

The structured filter layer 7 comprises an interference filter or a plasmonic filter. Both these filter types comprise a stack of different partial layers. An interference filter, for example, comprises alternating layers of dielectric materials with different index of refraction in the target spectrum. The thicknesses of the individual layers are determined by the filter design, for example by means of dedicated filter design software. The structured filter layer 7, designed as an interference filter, is adapted for defused incident light, i.e. light is incident from different directions and the characteristic transmission curve of the filter is only slightly dependent on the specific angle of incidence. Examples of interference filters include ultraviolet cut-off filters, infrared cut-off filters, photopic filters, color filters, band-pass filters and any combination thereof.

The diffuser 10 is spun on or arranged by means of molding on top of the dielectric layer 6. In order to assure that incident light is diffusive when leaving the diffusor 10, the diffuser 10 comprises a transparent organic layer having light scattering particles. The light scattering particles typically have a size greater than 0.1 up to 15 µm, in particular 0.2 to 15 µm, and more particularly between 1 to 15 µm, for example. Generally, the size is chosen so that scattering within the diffuser 10 can be described by geometric optics at least to first order of approximation. This assures that the angle dependence of the scattered light is not wavelength dependent. Furthermore, both the material of the diffuser 10 and that of the light scattering particles are chosen not to absorb light in the wavelength region of interest.

Besides particle size scattering depends on various other parameters including particle shape and density as well as diffuser thickness. Generally, the number of scattering events inside the diffuser 10 is increased with increasing particle density. The actual density can be adjusted to meet the requirements of the specific application. The diffuser thickness typically is around 20 to several 100 µm.

An exemplary material for the diffuser is an epoxy material. The diffuser comprising at least one epoxy layer can be hardened by ultraviolet light irradiation. By the choice of the proper epoxy material it can be ensured that the layer does not significantly change its transmission during thermal-, ultraviolet light-, or humidity-stress. Such a layer is also appropriate as a protective layer. Optionally, a transparent thin coating layer, which may typically be less than 30 µm thick, may be applied above the diffuser for protection and/or for an optical modification.

The diffuser 10 material may also comprise a silicone, i.e. a synthetic polymer compound, in which the light scattering particles such as titanium oxide are distributed. Silicone can be transparent in the visual and near infrared range. Furthermore, both epoxy and silicone can be applied by wafer level molding. In this case diffuser material can be structured by a mold tool and additional optical apertures, baffles and lenses can be manufactured into the same integrated optical sensor.

During operation of the integrated optical sensor light is incident and enters the sensor via the diffuser 10. Light may be incident in a parallel way or as diffused incident light originating from different directions. In any case, the incident light leaves the diffuser 10 with a diffusive or Lambertian intensity distribution. The structured filter layer 7 is adapted for such diffused incident light and has a characteristic transmission curve. Therefore the diffused incident light is filtered according to the transmission curves and only respective parts of the incident spectrum is allowed to pass. Light from other wavelengths are reflected or absorbed in the filter material. Finally, light having a wavelength from a desired range can reach the light sensitive component 3 in the integrated circuit 2 and gives rise to a respective sensor signal. The sensor signal can be tapped by means of the wiring 4 and either be preprocessed in the integrated circuit 2 or provided for further processing to external means connected to the wiring 4 via the through-substrate via 5 and the bumps 19, for example.

The proposed integrated optical sensor is an all integrated design and diminishes the need of an external aperture or an external diffuser in order to reduce angle dependency of the filter transmission curve. Furthermore, the design has the additional benefit that the diffuser 10 already is part of the sensor package. All processing steps can be carried out in a CMOS compatible process at a wafer level with a low additional costs. The overall design results in a superior angle dependence of the structured filter layer 7, e.g. an interference filter. This allows for a defined transmission characteristic. For example, true color filters and photopic filters can be realized based on the proposed design.

Figure 2:
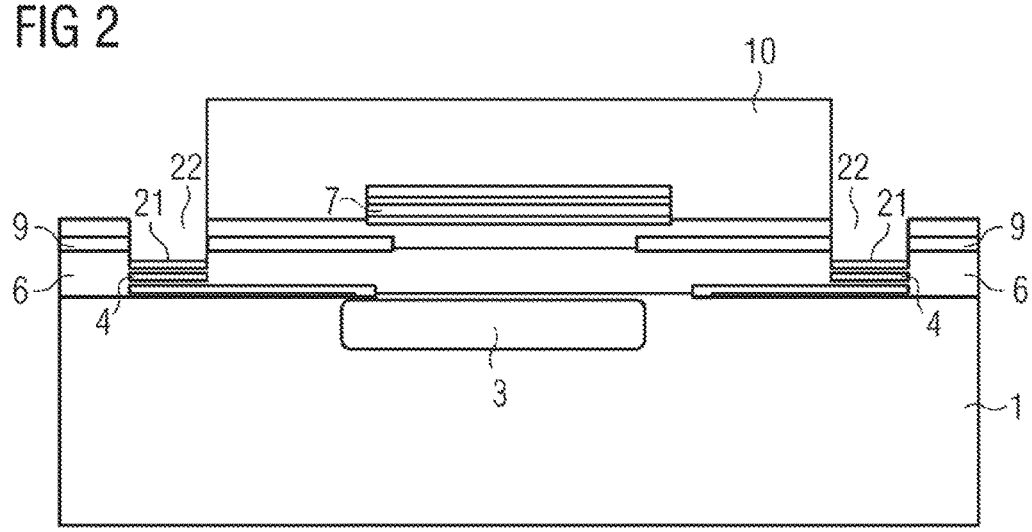
FIG. 2 shows another embodiment of an integrated optical sensor comprises a bonding pad.

FIG. 2 shows another embodiment of an integrated optical sensor comprises a bonding pad 21. This exemplary integrated optical sensor has a similar overall design in common with the sensor of FIG. 1. For easier representation not all the components shown in FIG. 1 are also shown in FIG. 2 but may be present nonetheless.

Figure 3:
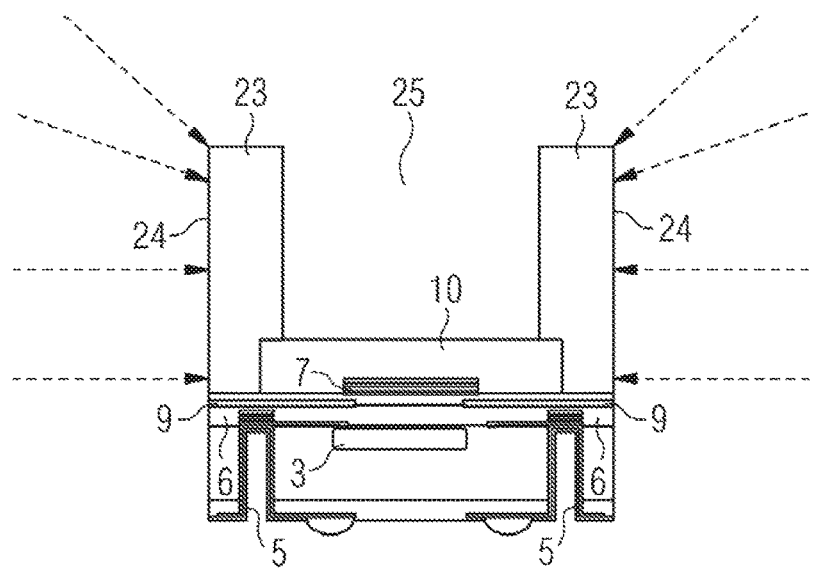
FIG. 3 shows another embodiment of an integrated optical sensor comprising an optical light barrier.

The integrated diffuser 10 is spun on or arranged by means of molding on top of the dielectric layer 6. However, the diffuser 10 these at least some parts of the surface of the dielectric layer 6 open to accommodate bonding pads 21. The bonding pads 21 are arranged into an opening 22 in the dielectric layer 6 and passivation layer 9. Furthermore, the bonding pads 21 comprise the wiring 4 formed as a structured metal layer. The bonding pads 21 provide electrical connectivity to external components the optical sensor signal for further processing. FIG. 3 shows another embodiment of an integrated optical sensor comprising an optical light barrier. This integrated optical sensor is based on the design presented with respect to FIG. 1. However, the optical light barrier can also be arranged in the design presented in FIG. 2. For easier representation not all the components shown in FIG. 1 are also shown in FIG. 2 but may be present nonetheless.

The optical light barrier 23 is arranged on the surface of the dielectric layer 6 and partly on a surface of the diffuser 10. Alternatively, the optical barrier 23 can also be arranged entirely on the surface of the dielectric layer 6. In both cases the optical light barrier 23 is arranged by means of a wafer level molding based on an organic material. The organic material not only is moldable but blocks light in a wide wavelength range (e.g. UV, VIS, and NIR). The optical light barrier 23 comprises sidewalls 24 which have a height over the dielectric layer surface of about 20 to several 100 µm. The specific height can be adjusted depending on the field of application of the integrated optical sensor.

For example, the integrated optical sensor is used together with the light emitting diode in the same optical package. In order to avoid or reduce optical crosstalk the optical light barrier 23 should be made high enough to block light 29 (dashed arrows) originating from a neighbouring light emitting diode or other neighbouring light sources, like ambient light. An example for such an optical sensor is a proximity sensor. By means of the optical light barrier 23 the portion of light which should be measured, for example, by external reflection of light emitted by the light emitting diode by our an external object, can enter an aperture 25 of the optical light barrier 23 while direct emission from light sources like the light emitting diode is effectively blocked. This way only the portion of light of interest is measured and gives rise to an optical sensor signal. Please note, that the aperture 25 is not required to limit the angle of incidence on the light sensitive component 3 to small values of about +/−10°. Its functionality rather relates to reduce reduction of optical crosstalk from neighbouring light sources. Therefore, the aspect ratio of aperture height versus diameter of the optical light barrier 23 can be rather relaxed.

Figure 4:
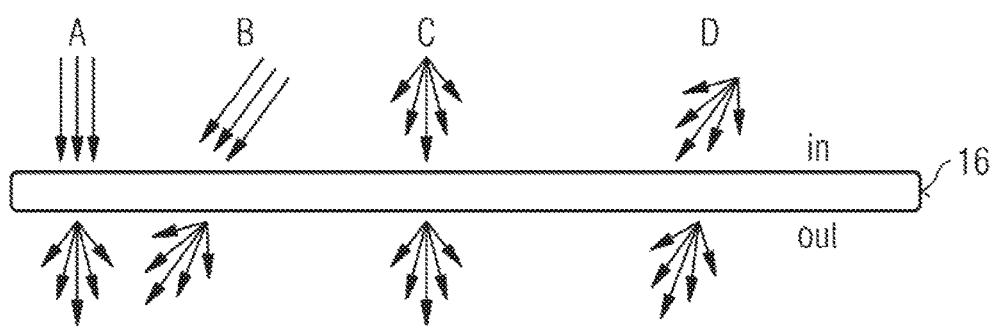
FIG. 4 shows an exemplary intensity distribution for light leaving a diffuser
Figure 5:
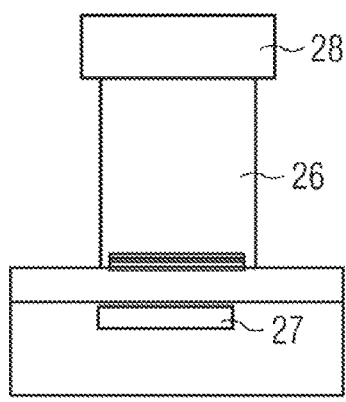
FIG. 5 shows a prior art solution of an optical sensor with an external aperture and external diffusor.

FIG. 4 shows an exemplary intensity distribution for light leaving a diffuser. The graph schematically shows the effect of the diffusor 10 for parallel and diffusive incident light (cases A to D, respectively).

The drawing shows parallel incident light A having an angle of incidence of 0°, parallel incident light B having an inclined angle of incidence, and diffused incident light C, and D having an angle of incidence of 0° or an inclined angle, respectively. The diffuser 10 has the effect that in any of the cases A to D, diffusive light is leaving the diffusor 10 with a Lambertian intensity distribution. The structured filter layer 7, e.g. an interference filter design adapted for diffused light, follows the diffuser 10 in the optical path within the integrated optical sensor. Therefore the operation of the integrated optical sensor is largely independent on whether parallel and diffusive light is incident on the sensor itself. Thus, depending on the thickness of the diffuser 10 the field of view of the integrated optical sensor can be rather large while still pertaining the reduced angle dependency of the filter characteristic curve.

REFERENCE NUMERALS 1 semiconductor substrate
2 integrated circuit
3 light sensitive component
4 wiring
5 through substrate via
6 dielectric layer
7 structured filter layer
8 inter-metal layer
9 passivation layer
10 diffuser
11 main surface
12 rear surface
13 aperture (in the passivation layer)
15 metallization
16 contact area
17 rear wiring
18 further dielectric layer
19 passivation
20 passivation
21 bonding pad
22 opening
23 optical light barrier
24 sidewall
25 aperture of the optical light barrier
26 cylindrical tube (external)
27 optical sensors
28 additional diffusor (external)
29 light arrow
A parallel incoming light
B parallel incoming light
C diffused incoming light
D diffused incoming light
in incoming
λ wavelength in nm
out outgoing
T transmission in %
T1 transmission curve 0°
T2 transmission curve 10°
T3 transmission curve 20°
T4 transmission curve 30°
T5 transmission curve 0°
T6 transmission curve 10°
T7 transmission curve 20°
T8 transmission curve 30°
T* transmission curve (superposition)
X1 tri stimulus filter
X2 tri stimulus filter

The invention claimed is:

1. An integrated optical sensor, comprising:
a semiconductor substrate having a main surface,
an integrated circuit comprising at least one light sensitive component, the integrated circuit being arranged in the substrate at or near the main surface,
a dielectric layer comprising at least one compound of a semiconductor material, the dielectric layer being arranged on or above the main surface,
a wiring for providing an electrical connection to the integrated circuit, the wiring being arranged in the dielectric layer and being connected to the integrated circuit,
a structured filter layer arranged on the dielectric layer and facing the at least one light sensitive component, wherein the structured filter layer is adapted for diffused incident light by means of succession and properties of the layers which make up the filter, and wherein the structured layer comprises a plurality of filter layers in a stack, and wherein a succession of the filter layers in the stack and properties of the filter layers in the stack are such that a transmission curve of the structured filter layer shifts less than 20 nm within an interval of angles of incidence of light of at least ±10° on the structured filter layer, and
a diffuser arranged on the structured filter layer.

2. The integrated optical sensor according to claim 1, wherein the structured filter layer is arranged immediately on the dielectric layer and the diffuser is arranged immediately on the dielectric layer and structured filter layer such that the diffuser encloses the dielectric layer and structured filter layer.

3. The integrated optical sensor according to claim 1, wherein the diffuser comprises a translucent material further comprising light scattering particles, the light scattering particles having a size sufficiently larger than the wavelength of the diffused incident light such that the laws of geometric optics apply to describe the interaction of light with the particle, the light scattering particles having a size sufficiently large so that a ratio of particle size to wavelength is more than about 10.

4. The integrated optical sensor according to claim 3, wherein the translucent material comprises an organic polymer compound or comprises a synthetic polymer compound, including an epoxy resin or a silicone rubber.

5. The integrated optical sensor according to claim 1, wherein the structured filter layer comprises an interference filter and/or a plasmonic filter.

6. The integrated optical sensor according to claim 1, further comprising an electrically conductive through-substrate via in the dielectric layer contacting the wiring.

7. The integrated optical sensor according to claim 1, further comprising an electrically conductive bonding pad in the dielectric layer contacting the wiring.

8. The integrated optical sensor according to claim 1, wherein the dielectric layer comprises an inter-metal layer, and
the wiring is arranged in the inter-metal layer.

9. The integrated optical sensor according to claim 8, wherein
the dielectric layer comprises a passivation layer at least above the wiring,
the passivation layer comprises a dielectric material different from the inter-metal layer, and
the wiring is arranged between the main surface and the passivation layer.

10. The integrated optical sensor according to claim 9, wherein
the passivation layer is arranged in or on the inter-metal layer,
the passivation layer comprises an aperture facing the at least one light sensitive component, the inter-metal layer being free from the passivation layer in the aperture, and
the structured filter layer is arranged on the inter-metal layer above or in the aperture of the passivation layer.

11. The integrated optical sensor according to claim 1, comprising an optical light barrier arranged on or near the diffuser and/or the dielectric layer.

12. The integrated optical sensor according to claim 1, wherein the succession of the filter layers in the stack and properties of the filter layers in the stack comprises at least one of thicknesses of the filter layers in the stack or indices of refraction of the layers in the stack.

13. A method of producing an integrated optical sensor, comprising the steps of:
providing a semiconductor substrate with an integrated circuit comprising at least one light sensitive component at or near a main surface of the substrate,
arranging a dielectric layer comprising at least one compound of a semiconductor material on or above the main surface,
arranging a wiring in the dielectric layer for providing an electrical connection to the integrated circuit,
arranging a structured filter on the dielectric layer and facing the at least one light sensitive component, wherein the structured filter layer is adapted for diffused incident light by means of succession and properties of the layers which make up the filter, and wherein the structured layer comprises a plurality of filter layers in a stack, and wherein a succession of the filter layers in the stack and properties of the filter layers in the stack are such that a transmission curve of the structured filter layer shifts less than 20 nm within an interval of angles of incidence of light of at least $\pm 10°$ on the structured filter layer, and
arranging a diffuser on the structured filter layer.

14. The method according to claim 13, wherein
the diffuser is provided with a translucent material further comprising light scattering particles, the light scattering particles having a size sufficiently larger than the wavelength of the diffused incident light such that the laws of geometric optics apply to describe the interaction of light with the particle, and
the diffuser is arranged on the structured filter layer by means of wafer-level spinning and/or by means of wafer-level molding.

15. The method according to claim 13, wherein the translucent material is made from an organic polymer compound or from a synthetic polymer compound, including an epoxy resin or from a silicone rubber.

16. The method according to claim 13, further comprising the steps of:
forming the dielectric layer to further comprise an inter-metal layer and a passivation layer,
providing in the passivation layer an aperture facing the at least one light sensitive component, the inter-metal layer being free from the passivation layer in the aperture, and
arrange the structured filter layer on the inter-metal layer above or in the aperture of the passivation layer.

17. The method according to claim 13, wherein an optical light barrier is arranged on or near the diffuser and/or the dielectric layer.

* * * * *